(12) United States Patent
Miller

(10) Patent No.: US 7,764,075 B2
(45) Date of Patent: Jul. 27, 2010

(54) HIGH PERFORMANCE PROBE SYSTEM

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/259,785

(22) Filed: Oct. 28, 2008

(65) Prior Publication Data

US 2009/0134895 A1 May 28, 2009

Related U.S. Application Data

(60) Division of application No. 11/758,525, filed on Jun. 5, 2007, now Pat. No. 7,443,181, which is a continuation of application No. 11/273,889, filed on Nov. 14, 2005, now Pat. No. 7,227,371, which is a division of application No. 10/142,548, filed on May 8, 2002, now Pat. No. 6,965,244.

(51) Int. Cl.
*G01R 31/02* (2006.01)

(52) U.S. Cl. .................................... 324/754

(58) Field of Classification Search ........................ None
See application file for complete search history.

(56) References Cited

U.S. PATENT DOCUMENTS

| | | | |
|---|---|---|---|
| 4,734,046 A | 3/1988 | McAllister et al. |
| 5,089,772 A | 2/1992 | Hatada et al. |
| 5,180,977 A | 1/1993 | Huff |
| 5,412,866 A | 5/1995 | Woith et al. |
| 5,563,521 A | 10/1996 | Crumly |
| 5,604,446 A | 2/1997 | Sano |
| 5,623,213 A | 4/1997 | Liu et al. |
| 5,672,977 A | 9/1997 | Yamada |
| 5,785,794 A | 7/1998 | Fiedler |
| 5,847,571 A | 12/1998 | Liu et al. |
| 5,917,707 A | 6/1999 | Khandros et al. |
| 5,973,504 A | 10/1999 | Chong |
| 5,974,662 A | 11/1999 | Eldridge et al. |
| 6,064,213 A | 5/2000 | Khandros et al. |
| 6,218,910 B1 | 4/2001 | Miller |
| 6,255,126 B1 | 7/2001 | Mathieu et al. |

(Continued)

FOREIGN PATENT DOCUMENTS

CN 2351845 Y 12/1999

(Continued)

OTHER PUBLICATIONS

U.S. Appl. No. 08/819,464, filed Mar. 17, 1997, Dozier.

(Continued)

*Primary Examiner*—Jermele M Hollington
(74) *Attorney, Agent, or Firm*—N. Kenneth Burraston

(57) ABSTRACT

A probe system for providing signal paths between an integrated circuit (IC) tester and input/output, power and ground pads on the surfaces of ICs to be tested includes a probe board assembly, a flex cable and a set of probes arranged to contact the IC's I/O pads. The probe board assembly includes one or more rigid substrate layers with traces and vias formed on or within the substrate layers providing relatively low bandwidth signal paths linking the tester to probes accessing some of the IC's pads. The flex cable provides relatively high bandwidth signal paths linking the tester to probes accessing others of the IC's pads.

7 Claims, 10 Drawing Sheets

U.S. PATENT DOCUMENTS

Figure 1:
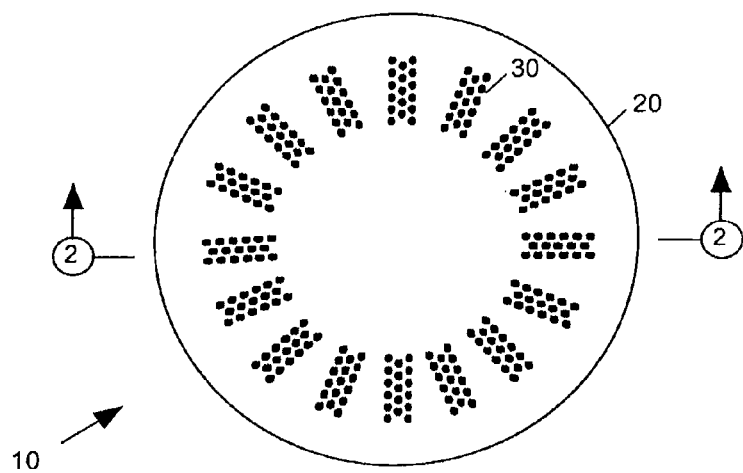

| | | |
|---|---|---|
| 6,268,015 B1 | 7/2001 | Mathieu et al. |
| 6,336,269 B1 | 1/2002 | Eldridge et al. |
| 6,441,315 B1 | 8/2002 | Eldridge et al. |
| 6,456,103 B1 | 9/2002 | Eldridge et al. |
| 6,482,013 B2 | 11/2002 | Eldridge et al. |
| 6,501,343 B2 | 12/2002 | Miller |
| 6,529,027 B1 | 3/2003 | Akram et al. |
| 6,539,531 B2 | 3/2003 | Miller et al. |
| 6,603,323 B1 | 8/2003 | Miller et al. |
| 6,606,575 B2 | 8/2003 | Miller |
| 6,640,415 B2 | 11/2003 | Eslamy et al. |
| 6,641,430 B2 | 11/2003 | Zhou et al. |
| 6,657,455 B2 | 12/2003 | Eldridge et al. |
| 6,676,438 B2 | 1/2004 | Zhou et al. |
| 6,911,835 B2 | 6/2005 | Chraft et al. |
| 6,939,474 B2 | 9/2005 | Eldridge et al. |
| 6,965,244 B2 | 11/2005 | Miller |
| 7,012,442 B2 | 3/2006 | Miller |
| 7,071,715 B2 | 7/2006 | Shinde et al. |
| 7,189,077 B1 | 3/2007 | Eldridge et al. |
| 7,227,371 B2 | 6/2007 | Miller |
| 7,443,181 B2 | 10/2008 | Miller |
| 2001/0012739 A1 | 8/2001 | Grube et al. |
| 2001/0044225 A1 | 11/2001 | Eldridge et al. |
| 2002/0132501 A1 | 9/2002 | Eldridge et al. |
| 2003/0067316 A1 | 4/2003 | Miller |
| 2004/0036493 A1 | 2/2004 | Miller |

FOREIGN PATENT DOCUMENTS

| | | |
|---|---|---|
| EP | 0259162 | 3/1988 |
| JP | 59-215737 | 12/1984 |
| JP | 60-260861 | 12/1985 |
| JP | 61-077286 | 4/1986 |
| JP | 61-133876 | 6/1986 |
| JP | 63-065638 | 3/1988 |
| JP | 02-237131 | 9/1990 |
| JP | 06-140484 | 5/1994 |
| JP | 07-083953 | 3/1995 |
| JP | 11-014245 | 1/1999 |
| JP | 2000-067953 | 3/2000 |
| JP | 2000-206182 | 7/2000 |
| JP | 2001-153885 | 6/2001 |
| JP | 2002-217255 | 8/2002 |
| JP | 2003-035725 | 2/2003 |
| WO | WO 96/13967 | 5/1996 |
| WO | WO 00/75677 | 12/2000 |
| WO | WO 01/09623 | 2/2001 |
| WO | WO 01/71779 | 9/2001 |

OTHER PUBLICATIONS

Search Report for international patent application PCT/US03/14490 (Dec. 30, 2003).

HIGH PERFORMANCE PROBE SYSTEM

This application is a divisional of U.S. patent application Ser. No. 11/758,525, filed Jun. 5, 2007 (now U.S. Pat. No. 7,443,181), issue date Oct. 28, 2008 which is a continuation of U.S. patent application Ser. No. 11/273,889, filed Nov. 14, 2005 (now U.S. Pat. No. 7,227,371), issue date Jun. 5, 2007 which is a divisional of U.S. patent application Ser. No. 10/142,548, filed May 8, 2002 (now U.S. Pat. No. 6,965,244) issue date Nov. 15, 2005.

BACKGROUND OF THE INVENTION

1. Field of the Invention

The invention relates to a system for providing paths suitable for high frequency signals passing between an integrated circuit (IC) test equipment and pads on the surfaces of ICs to be tested.

2. Description of Related Art

Integrated circuits (ICs) are often tested while still in the form of die on a semiconductor wafer. The following U.S. patents describe exemplary probe board assemblies for providing signal paths between an integrated circuit tester and input/output (I/O), power and ground pads on the surfaces of ICs formed on a semiconductor wafer: U.S. Pat. No. 5,974,662 issued Nov. 2, 1999 to Eldridge et al, U.S. Pat. No. 6,064,213 issued May 16, 2000 to Khandros, et al and U.S. Pat. No. 6,218,910 issued Apr. 17, 2001 to Miller.

Figure 2:
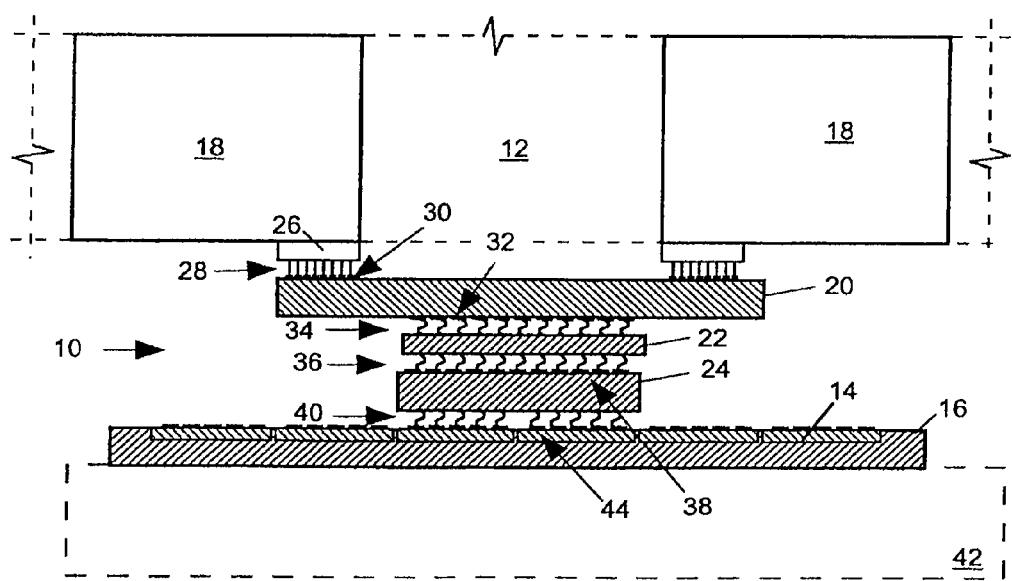

FIG. 1 is a plan view and FIG. 2 is a sectional elevation view of an exemplary prior art probe board assembly 10 for providing signal paths between an integrated circuit tester 12 and ICs 14 formed on a semiconductor wafer 16. Tester 12 implements one or more tester channels, each providing a test signal as input to one of ICs 14 or receiving and processing an IC output signal to determine whether the IC output signal is behaving as expected. Probe card assembly 10 includes a set of pogo pin connectors 26 and a set of three interconnected substrate layers including an interface board 20, an interposer 22 and a space transformer 24. Pogo pins 28 provide signal paths between tester 12 and contact pads 30 on the upper surface of interface board 20. Interface board 20 is typically a multiple layer printed circuit board including microstrip and stripline traces for conveying signals horizontally and vias for conveying signals vertically between pads 30 on its planar upper surface and a set of contact pads 32 on its planar lower surface.

Interposer 22 includes one set of spring contacts 34 mounted on its upper surface and a corresponding set of spring contacts 36 mounted on its lower surface. Each spring contact 34 contacts a separate one of the pads 32 on the lower surface of interface board 20, and each spring contact 36 contacts one of a set of pads 38 on the upper surface of space transformer 24. Vias passing through interposer 22 provide signal paths between corresponding pairs of spring contacts 34 and 36.

Space transformer 24 provides signal paths linking spring contacts 36 to a set of probes 40 arranged to contact I/O, power and ground pads 44 on the surfaces of a set of ICs 14 to be tested. A chuck 42 positions wafer 16 with probes 40 in alignment with IC pads 44 of the ICs 14 to be tested. After one group of ICs 14 have been tested, chuck 42 repositions wafer 16 so that probes 40 access the IC pads 44 of a next group of ICs to be tested.

Various types of structures can be used to implement probes 40 including, for example, wire bond and lithographic spring contacts, needle probes, and cobra probes. In some probe systems, probes 40 are implemented as spring contacts formed on the lower surface of space transformer 24 with their tips extending downward to contact IC pads 44 on the surfaces of ICs 14. Alternatively, spring contact type probes 40 are attached to the IC's pads 44 with their tips extending upward to contact pads on the lower surface of space transformer 24.

A test signal generated by a tester channel implemented within one of circuit boards 18 travels through a pogo pin 28 to one of pads 30 on the surface of interface board 20, and then travels through traces and vias within interface board 20 to one of pads 32 on its lower surface. The test signal then passes-through one of spring contacts 34, through a via within interposer 22, and through one of spring contacts 36 to one of contacts 38 on the surface of space transformer 24. Traces and vias within space transformer 24 then deliver the test signal to a probe 40 which then conveys the test signal to an IC pad 44 on the surface of one of ICs 14. An IC output signal produced at one of IC pads 44 follows a similar path in an opposite direction to reach a channel within one of circuit boards 18. As described in detail in the aforementioned U.S. Pat. No. 5,974,662, interposer 22, with its flexible spring contacts 34 and 36, provides compliant electrical connections between interface board 20 and space transformer 24. Probes 40 may be made sufficiently resilient to compensate for any variation in elevation of the IC pads 44 on the upper surfaces of ICs 14.

FIG. 2 has an expanded vertical scale to more clearly show the various components of probe board assembly 10. The horizontal area over which pogo pins 28 are actually distributed is typically many times larger than the area over which probes 40 are distributed. Probe card assembly 10 is well adapted for connecting I/O ports of tester channels that are distributed over a relatively wide horizontal area to a set of probes 40 that are aligned to access IC pads 44 that are densely packed into a relatively small horizontal area.

One problem probe board assembly 10 shares to some degree with any interconnect system, is that the signal paths it provides tend to distort and attenuate signals, particularly signals having high frequency components. What is needed is a probe board assembly for providing signal paths between an IC tester and pads on one or more ICs, wherein at least some of the IC pads transmit and receive high frequency signals.

BRIEF SUMMARY OF THE INVENTION

A system for providing signal paths between an integrated circuit (IC) tester and input/output (I/O), power and ground pads of ICs to be tested includes a probe board assembly, a flex cable and a set of probes arranged to contact the IC's pads. The probe board assembly includes one or more substrate layers (which may be rigid) and signal paths through the substrate layer(s) for linking the tester to one set of the probes. The flex cable includes a flexible substrate structurally linked to a layer of the probe board assembly and a set of signal paths through the flexible substrate for linking the tester to another set of the probes.

Figure 6:
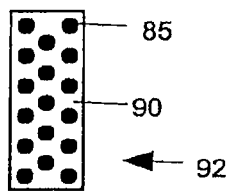
Figure 7:
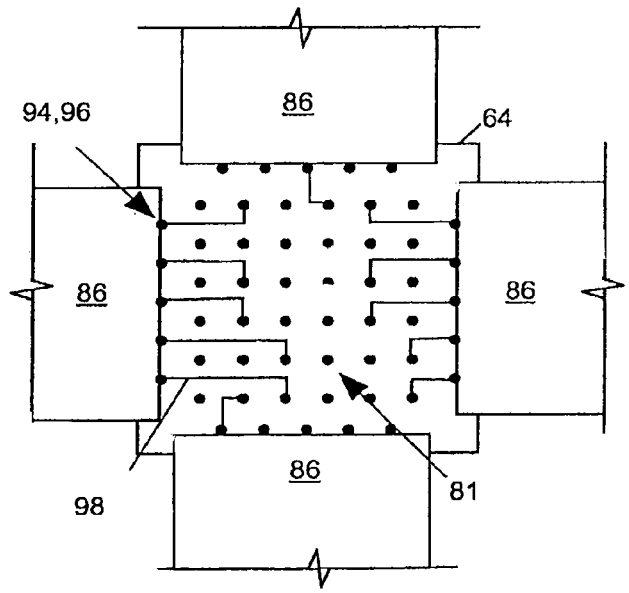
Figure 8:
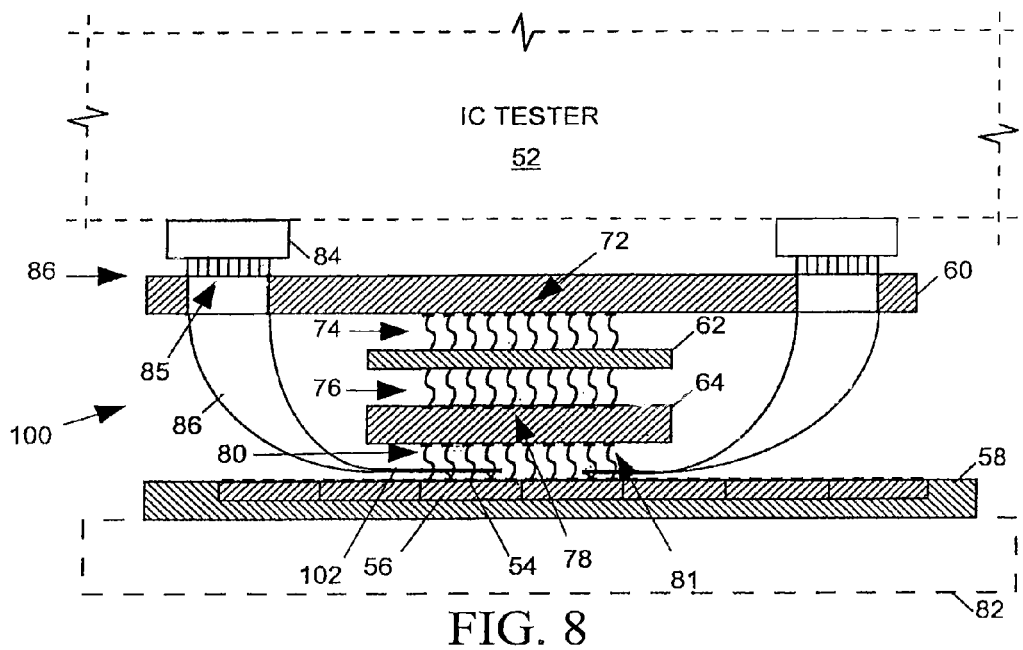
Figure 9:
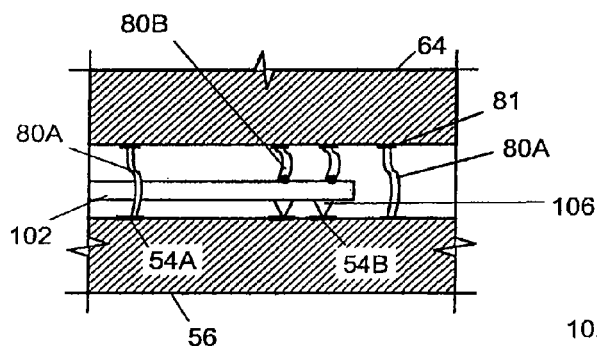
Figure 10:
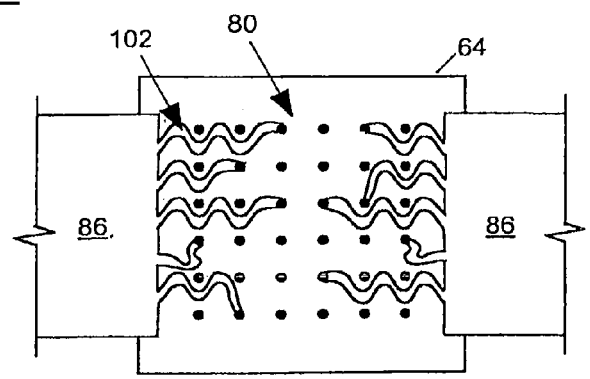
Figure 11:
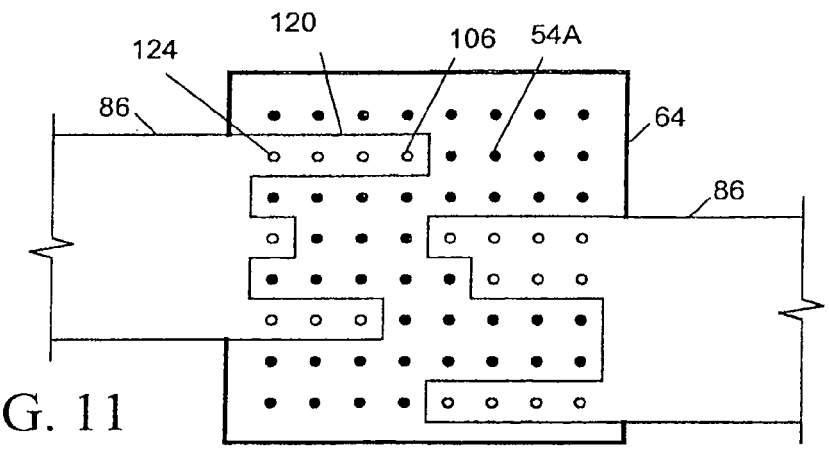
Figure 12:
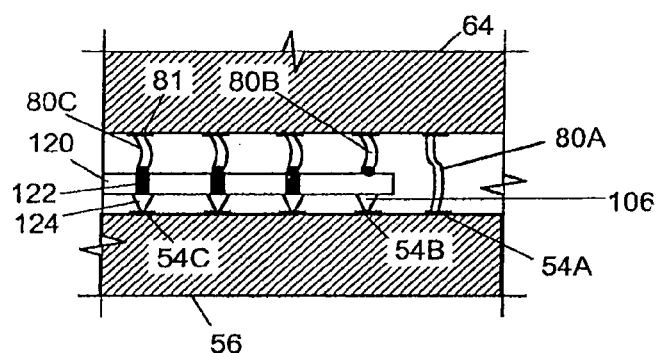
Figure 13:
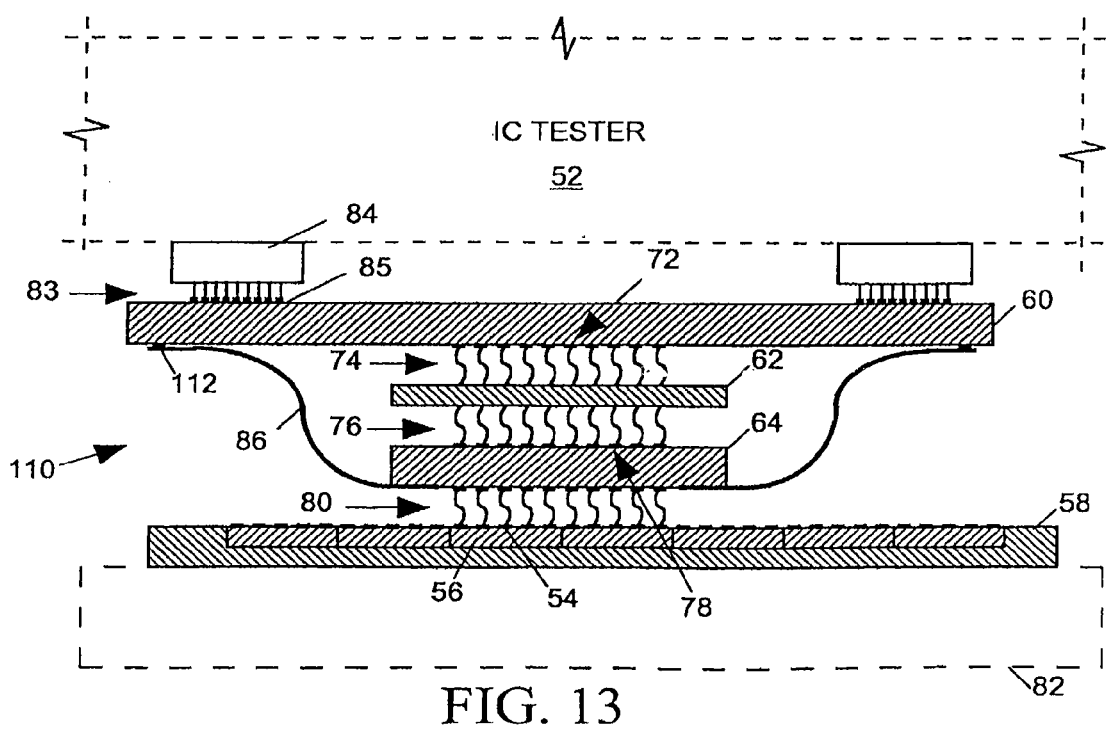
Figure 14:
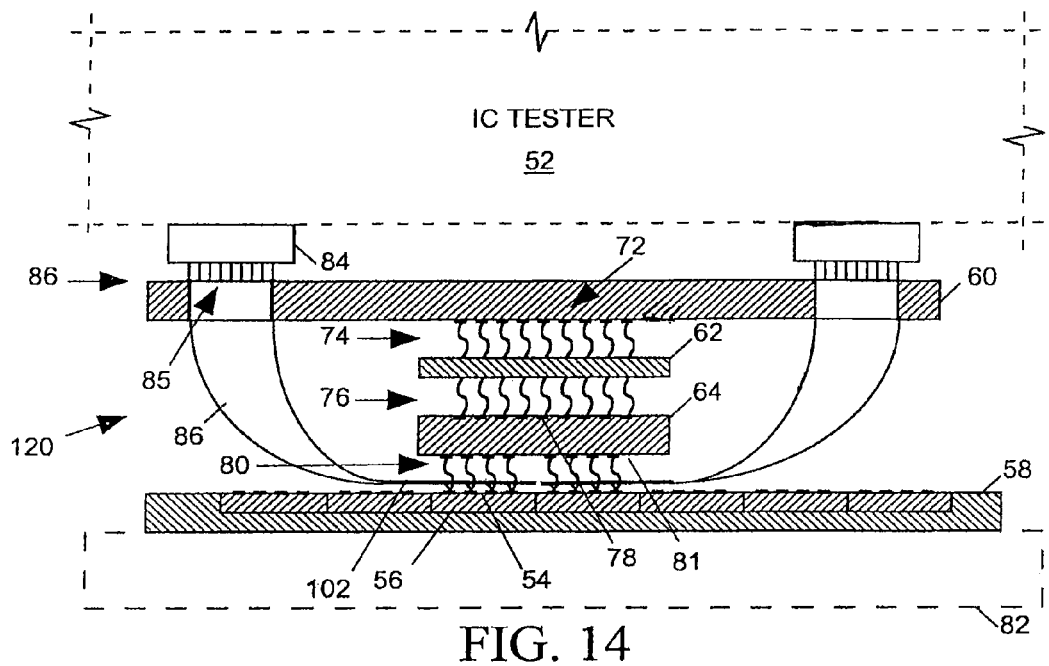
Figure 15:
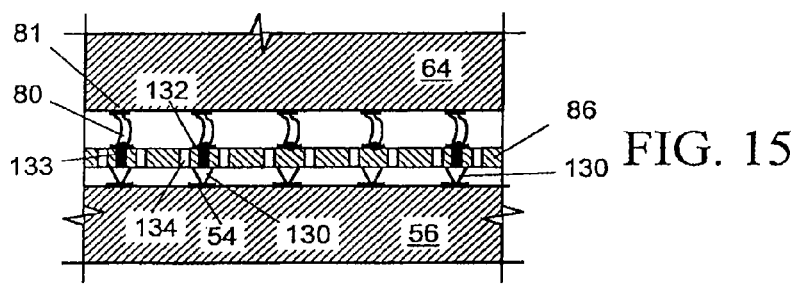
Figure 16:
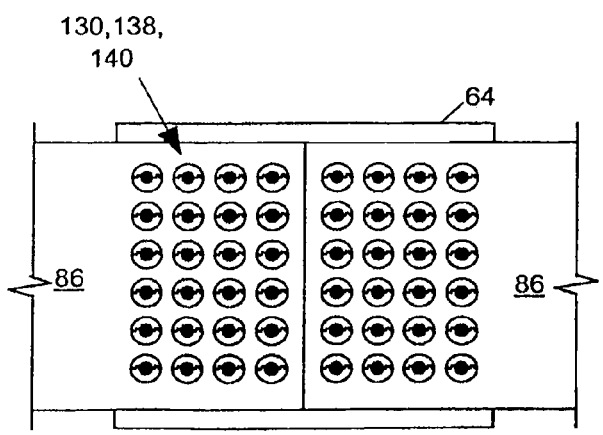
Figure 17:
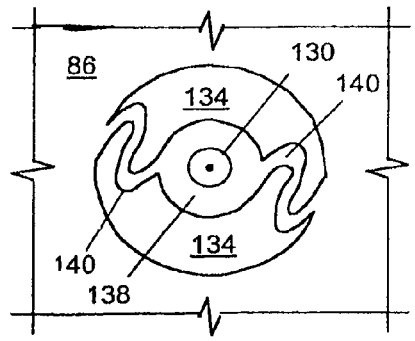
Figure 18:
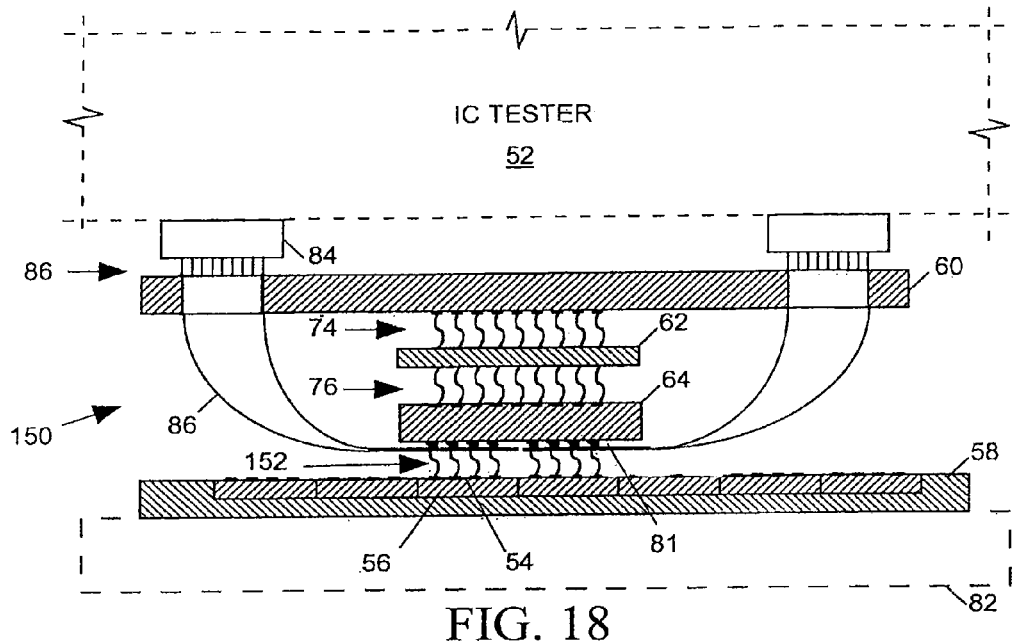
Figure 19:
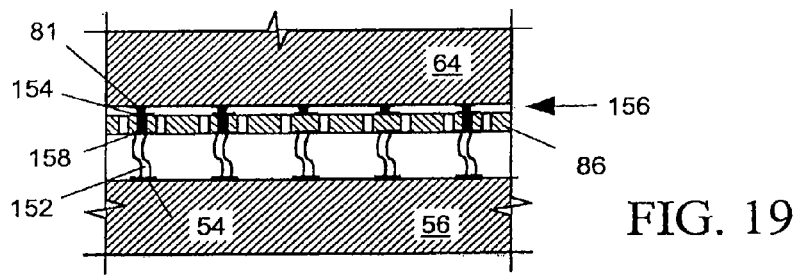
Figure 20:
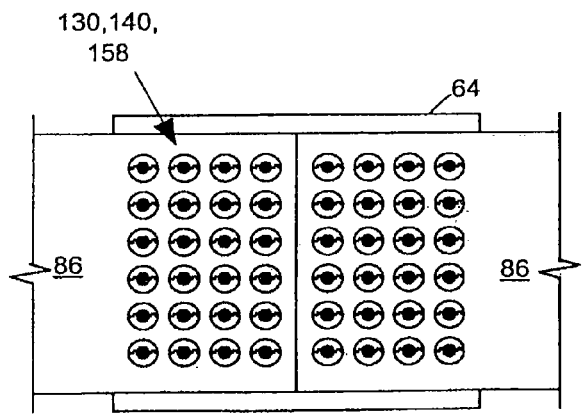
Figure 21:
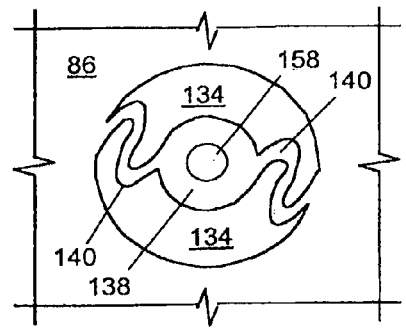
Figure 22A:
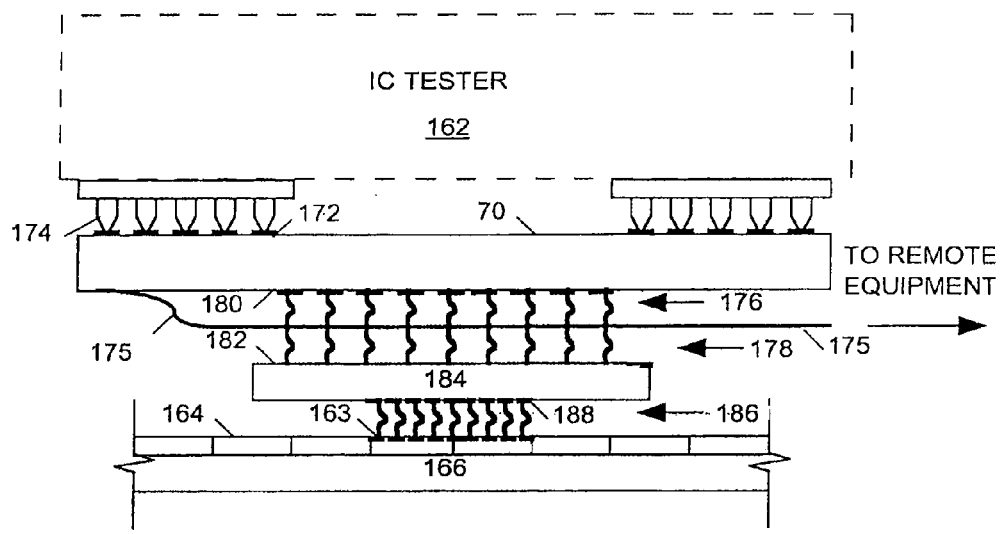
Figure 22B:
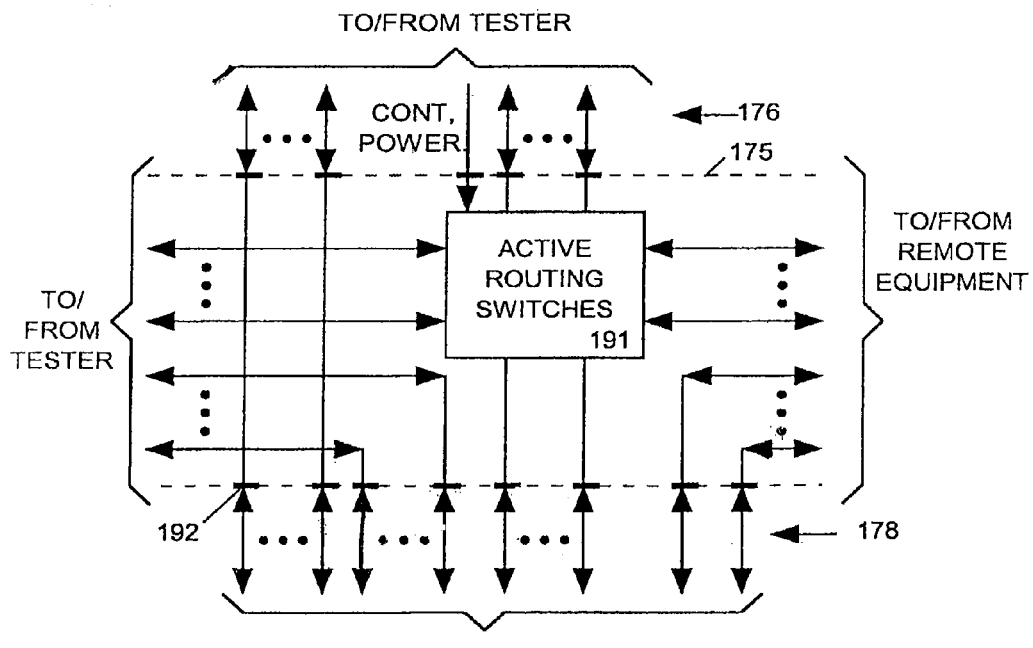
Figure 23A:
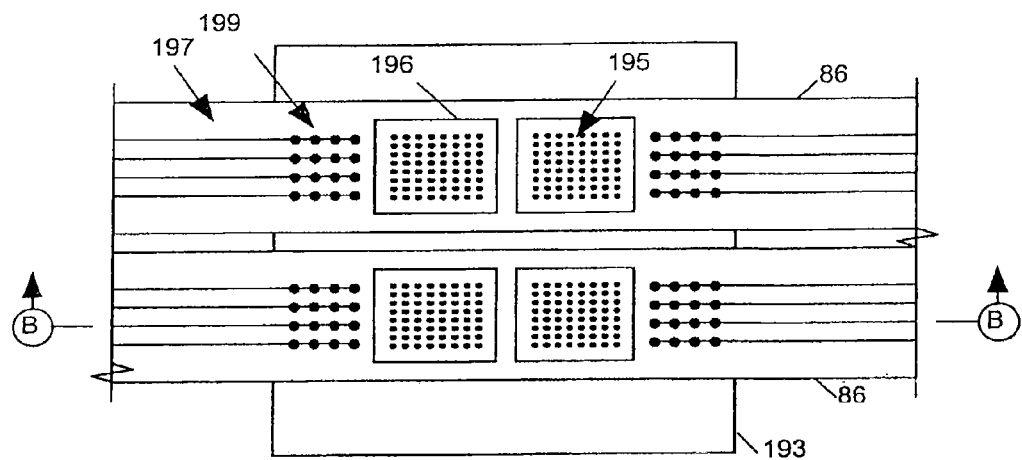
Figure 23B:
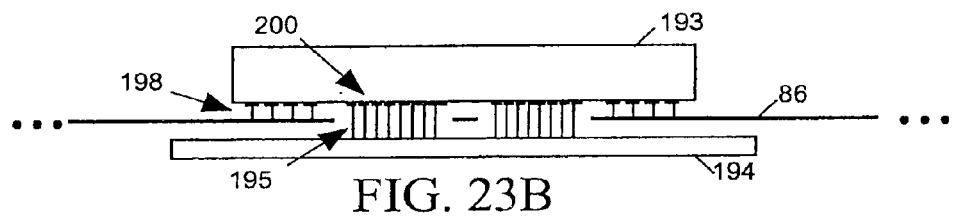

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, FIG. 1 is a plan view of a prior art probe board assembly for providing signal paths between an integrated circuit (IC) tester and input/output, power and ground pads on an array of ICs, FIG. 2 is a sectional elevation view of the prior art probe board assembly of FIG. 1, FIG. 3 is a plan view of a probe system in accordance with an exemplary embodiment of the invention for providing signal paths between an IC tester and pads on one or more ICs, FIGS. 4 and 5 are sectional elevation views the probe system of FIG. 3, FIG. 6 is a plan view of the flex cable termination block of FIG. 5, FIG. 7 is a plan view of the lower surface of the space transformer of the probe system of FIG. 3, FIG. 8 is a sectional elevation view of a probe system in accordance with a second exemplary embodiment of the invention for providing signal paths between an IC tester and pads on one or more ICs, FIG. 9 is an expanded partial sectional elevation view of the probe system of FIG. 8, FIG. 10 is a plan view of the lower surface of the space transformer of the probe system of FIG. 8, FIG. 11 is a plan view of the lower surface of a space transformer of a third exemplary embodiment of the invention for providing signal paths between an IC tester and pads on one or more ICs, FIG. 12 is an expanded partial sectional elevation view of the probe system of FIG. 11, FIG. 13 is a sectional elevation view of a probe system in accordance with a fourth exemplary embodiment of the invention for providing signal paths between an IC tester and pads on one or more ICs, FIG. 14 is a sectional elevation view of a probe system in accordance with a fifth exemplary embodiment of the invention for providing signal paths between an IC tester and IC pads on one or more ICs, FIG. 15 is an expanded partial sectional elevation view of the probe system of FIG. 14, FIG. 16 is a plan view of the lower surface of the space transformer and the flex cables of the probe system of FIG. 14, and FIG. 17 is an expanded plan view of an area of flex cable of FIG. 16 containing a single substrate island, FIG. 18 is a sectional elevation view of a probe system in accordance with a sixth exemplary embodiment of the invention for providing signal paths between an IC tester and spring contacts formed on pads on one or more ICs, FIG. 19 is an expanded partial sectional elevation view of the probe system of FIG. 17, FIG. 20 is a plan view of the lower surface of the space transformer and the flex cables of the probe system of FIG. 17, FIG. 21 is an expanded plan view of an area of flex cable of FIG. 20 containing a single substrate island, FIG. 22A is a side elevation view of a probe system in accordance with a seventh exemplary embodiment of the invention for providing signal paths between an IC tester, remote test equipment and pads on one or more ICs, FIG. 22B is a block diagram illustrating signal paths within the flex cable of FIG. 22A, FIG. 23A is a plan view of a probe system in accordance with an eighth exemplary embodiment of the invention, FIG. 23B is a side elevation view of the probe system of FIG. 23A, and FIGS. 24A-24G illustrate steps in an exemplary embodiment of a process for forming probe tips on a flex cable in accordance with the invention.

DETAILED DESCRIPTION OF EXEMPLARY EMBODIMENTS OF THE INVENTION

The present invention is directed to a probe board assembly for providing signal paths between an integrated circuit (IC) tester and input/output (I/O), power and ground pads of one or more ICs to be tested either while the ICs are still in the form of die on a semiconductor wafer or after they have been separated from one another. The specification describes exemplary embodiments and applications of the invention considered by the applicant(s) to be the best modes of practicing the invention. It is not intended, however, that the invention be limited to the exemplary embodiments described below or to the particular manner in which the embodiments operate.

Figure 3:
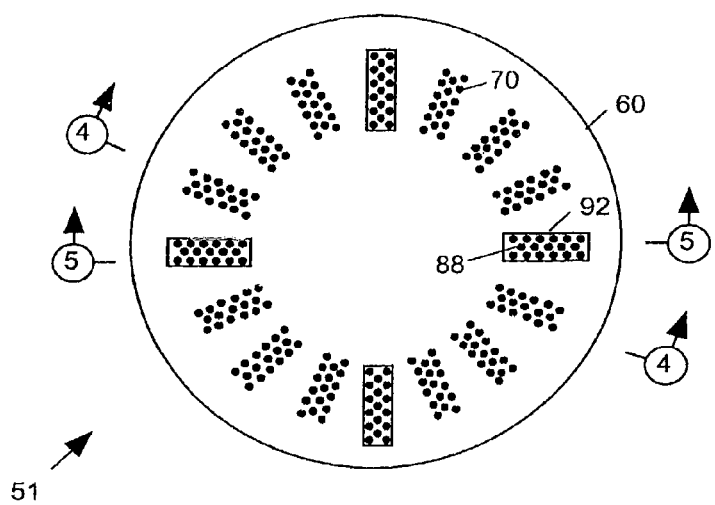
Figure 4:
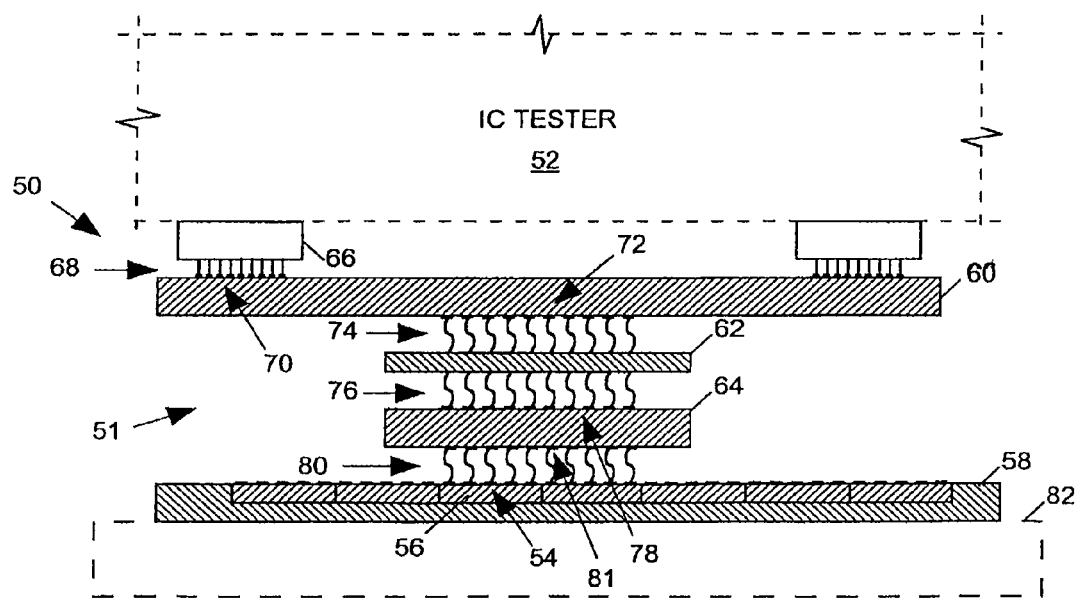
Figure 5:
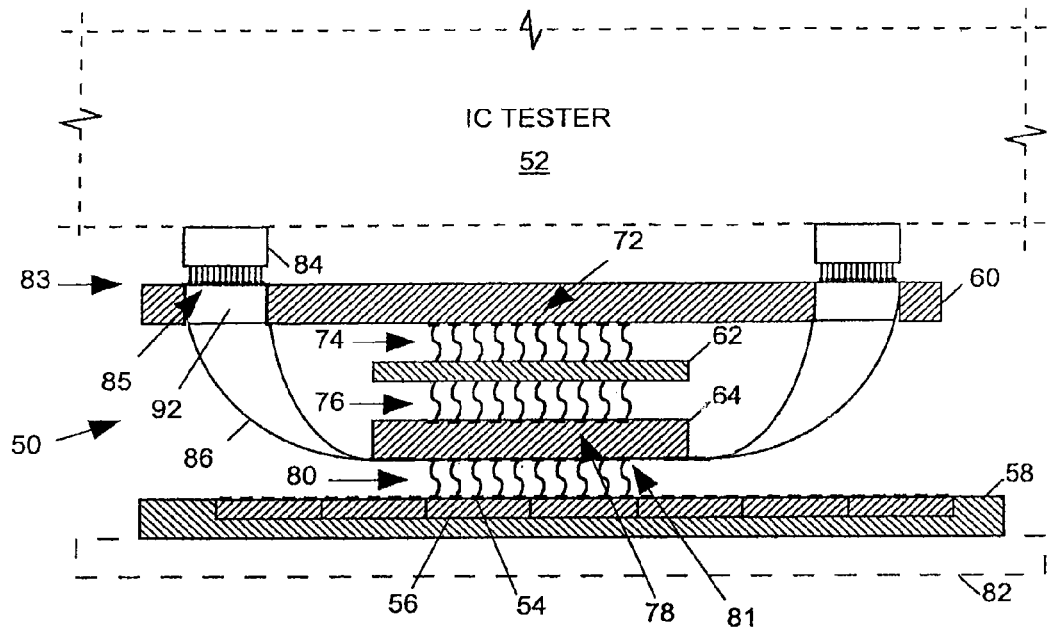

FIG. 3 is a plan view and FIGS. 4 and 5 are sectional elevation views of a probe system 50 in accordance with an exemplary embodiment of the invention for providing signal paths between an IC tester 52 to I/O, power and ground pads 54 on the surfaces of ICs 56, for example, while still in the form of die on a semiconductor wafer 58. Vertical dimensions in FIGS. 4 and 5 are exaggerated so that the individual components forming probe system 50 may be more easily distinguished.

Probe system 50 includes a probe board assembly 51 having multiple interconnected substrate layers, including an interface board 60, an interposer 62 and a space transformer 64. Pogo pin connectors 66 within IC tester 52 include a set of pogo pins 68 providing signal paths between the tester 52 and contact pads 70 residing in on the upper surface of interface board 60. Interface board 60 preferably, though not exclusively, comprises one or more layers of rigid insulating substrate material upon which are formed microstrip and/or stripline traces for conveying signals horizontally and through which are provided vias for conveying signals vertically between the pads 70 on its upper surface and a set of contact pads 72 on its lower surface.

Interposer 62 preferably, though not exclusively, includes a rigid insulating substrate having a set of flexible spring contacts 74 mounted on its upper surface and a corresponding set of flexible spring contacts 76 mounted on its lower surface. Each spring contact 74 contacts a separate one of the pads 72 on the lower surface of interface board 60, and each spring contact 76 contacts one of a set of pads 78 on the upper surface of space transformer 64. A set of conductive vias passing though interposer 62 provide signal paths between corresponding pairs of spring contacts 74 and 76.

Space transformer 64 provides signal paths linking the pads 78 on its upper surface to a set of probes 80 arranged to contact IC pads 54 on the surfaces of a set of ICs 56 to be tested. Wafer 58 resides on a chuck 82 for positioning wafer 58 so that probes 80 contact the pads 54 of the ICs 56 to be tested. After one group of ICs 56 have been tested, chuck 82 repositions wafer 56 so that probes 80 access the pads 54 of a next group of ICs 56 to be tested.

As described in more detail in the aforementioned U.S. Pat. No. 5,974,662, interposer 62, with its flexible spring contacts 74, 76, provides compliant electrical connections between interface board 60 and space transformer 64. Probes 80 may be sufficiently resilient to compensate for any variation in elevation of the pads 54 on the upper surfaces of ICs 56.

Various types of structures can be used to implement probes 80 including, for example, wire bond and lithographic spring contacts, needle probes, and cobra probes. Spring contacts may be formed on a pad or other base structure of a substrate in any of a number of ways. As one example, a spring contact may be formed by wire bonding a wire to the pad and overcoating the wire with a resilient material, such as disclosed in U.S. Pat. No. 6,336,269 issued Jan. 8, 2002 to Eldridge et al., incorporated herein by reference. As another example, a spring contact may be formed lithographically by depositing material in one or more molds formed over the pad and substrate examples of such lithographic techniques can be found in U.S. Pat. No. 6,255,126 issued Jul. 312, 2001 to Mathieu et al., and U.S. patent application Ser. No. 09/710,539 filed Nov. 9, 2000, both of which are incorporated herein by reference. U.S. patent application Ser. No. 09/746,716 filed Dec. 22, 2000 (also incorporated herein by reference) discloses yet another exemplary spring contact.

When spring contacts are employed to implement probes 80, they can be formed on the pads 54 of ICs 56 when space transformer 64 includes pads 81 on its lower planar surface arranged to contact the tips of the spring contacts. Alternatively, spring contact probes 80 may be formed on the pads 81 on the lower planar surface space transformer 64 and arranged so that their tips contact the pads 54 of ICs 54.

U.S. Pat. No. 6,064,213, issued May 16, 2000 to Khandros et al. (incorporated herein by reference) disclose and example of a card assembly designed to contact spring contacts formed on an IC. The following patents, each incorporated herein by reference, describe examples in which spring contact formed on a probe board assembly function as probes: U.S. Pat. No. 5,974,662 issued Nov. 2, 1999 to Eldridge et al.; U.S. patent application Ser. No. 09/810,874 filed Mar. 16, 2001; and U.S. Pat. No. 6,218,910 issued Apr. 17, 2001 to Miller.

A test, power or ground signal provided at an I/O port of an IC tester 52 travels through one of pogo pins 68 to one of pads 70 on the surface of interface board 60, and then travels through traces and vias within interface board 60 to one of pads 72 on its lower surface. The test signal then passes through one of spring contacts 74, through a via within interposer 62, and through one of spring contacts 76 to one of pads 78 on the surface of space transformer 64. Traces and vias within space transformer 64 then deliver the test signal to one of probes 80 which forwards the test signal to one of IC pads 54. An IC output signal generated at one of IC pads 54 follows a similar path in an opposite direction on its way back to an I/O port of a channel within tester 52.

As best seen in FIG. 5, probe system 50 provides a signal path between IC tester 52 and IC pads 54 suitable for conveying high frequency signals, for example up to approximately 100 GHz in frequency. A pogo pin connector 84 mounted on a lower edge of a printed circuit board within IC tester 52 provides pogo pins 83 for conveying high frequency signals between a tester channel I/O port and pads 85 formed on an end of a flex cable 86 linked to conductors within the flex cable. Opposite ends of the conductors within flex cable 86 are terminated on the lower surface of space transformer 64. Flex cable 86 includes a flexible substrate holding conductors for conveying signals. Various types of well-known flex cables may be used to implement flex cable 86. For example flex cable 86 may include one or more substrate layers of flexible polyimide, teflon, or other dielectric material upon which microstrip and/or strip-line conductors of copper or other conductive material are formed, for example through lithographic techniques, to provide uniform transmission line environments over the entire length of the flex cable. A flex cable 86 may provide parallel pairs of traces providing paths for high noise immunity differential signals.

Flex cable 86 may alternatively consist of or include one or more coaxial cables and may include other types of transmission lines formed on or within the flexible substrate for providing signal paths through the flex cable.

While the exemplary embodiments of the invention illustrated in FIGS. 4 and 5 employ pogo pin connectors 66 or 84 as signal paths between IC tester 52 and probe board 50, the signal paths between IC tester 52 and probe board 50 may be implemented in many other ways, such as for example through coaxial or flex cables or various types of well-known connectors such as SMB, SMP or SMA connectors.

As illustrated in FIG. 6, an upper end of flex cable 86 may be encased in epoxy 90 or other suitable insulating material to form a cable termination block 92. The top of termination block 92 may be ground to a flat surface to expose ends of the conductors. Conductive material deposited on the exposed conductor ends may provide pads 85 for receiving pogo pins 83. Each termination block 92 is suitably held by adhesive within an opening in interface board 60 with the termination block positioned so that the pads 85 on its upper surface reside in same plane on the upper surface of the interface board as pads 70 (FIG. 4).

FIG. 7 is an upward-directed plan view of the lower surface of space transformer 64 upon which four flex cables 86 are terminated. For simplicity, space transformer 64 is depicted as having an array of 36 probe pads 81 on its under surface upon which probes 80 (FIG. 5) may be formed, though in practice space transformer 64 may include a much larger array of pads 81. Exposed lower ends 94 of the conductors provided by flex cables 86 are connected (as by solder, wire bonds, conductive adhesive, or other means) to pads 96 on the lower surface of space transformer 64. Traces 98 formed on the lower surface of space transformer 64 link some of pads 96 to some of probe pads 81. Upward extending vias (not shown) may link other conductors 94 to traces (not shown) formed on higher layers of space transformer 64. The higher layer traces extend to other vias (not shown) passing downward to other probe pads 81.

A signal path between tester 52 and spring contacts 80 provided by pogo pins 83 and flex cable 86 of FIG. 5 can have a higher bandwidth than a signal path passing through probe board assembly 51 because most of the higher bandwidth path consists of a highly uniform transmission line environment having evenly distributed impedance. Also the higher bandwidth path includes substantially fewer junctions between dissimilar transmission lines that can cause signal attenuation and distortion. As described above, a signal path through pogo pins 66 (FIG. 4), interface board 60, interposer 62 and space transformer 64 may include 10 or more such junctions. A signal path though pogo pins 83 (FIG. 5), flex cable 86, and traces 96 (FIG. 7) on the lower surface of space transformer 64 includes only three transmission line junctions.

FIGS. 8-10 illustrate another example probe system 100 having much in common with probe system 50 of FIGS. 3-5 and, accordingly, similar reference characters refer to similar structures. However probe system 100 differs from probe board assembly 51 not only because it employs two flex cables 86 instead of four, but also because the lower ends of the conductors within flex cables 86 are coupled to IC pads 54 in a way that bypasses spring contacts 80.

As illustrated in FIGS. 8-10, flex cable 86 includes serpentine substrate fingers 102 containing conductors forming signal paths extending into the area under space transformer 64 occupied by probes 80. Bypassing various probes 80A carrying signals between space transformer 64 and various IC pads 54A, each finger 102 extends over one or more IC pads 54B that are to transmit or receive high frequency signals via the transmission line(s) included in the finger. Pointed conductive tips 106 formed on the underside of fingers 102 act as probes to provide signal paths between the transmission lines residing within the fingers and the high frequency IC pads 54B.

Ends of spring contacts 80B that are somewhat shorter than the spring contacts BOA that carry lower frequency signals to and from IC pads 54A are bonded to the upper surfaces of flex cable fingers 102 to structurally link each finger 102 to the under surface of space transformer 64. Spring contacts 80B do not carry signals but instead act as flexible structural member for holding fingers 102 in place under space transformer 64 so that their tips 106, and restricting their range of motion relative to the space transformer so that they are properly aligned with IC pads 54B. Thus the uniform transmission line environments provided by conductors within flex cables 86 extend from pogo pins 83 all the way down to the tips 106 acting as probes to contact IC pads 54B. Note that the flex cable termination arrangement of probe system 100 eliminates probe 80 and signal paths within space transformer 64 needed by the cable termination arrangement of probe system 50 of FIGS. 5-7 and therefor reduces the number of transmission line junctions in the signal path.

ICs 56 may warm up and expand while they are being tested and thereby may cause IC pads 54 to move vertically and to move apart horizontally. Fingers 102 are flexible so that tips 106 can move vertically as necessary to allow them to remain in contact with IC pads 54B. Fingers 102 preferably extend in a serpentine manner under space transformer 64 as illustrated in FIG. 10 to provide them with longitudinal flexibility to permit tips 54B to move horizontally relative to one another as necessary to remain in contact with IC pads 54B. Space transformer 64 is preferably formed of a ceramic or other substrate material having a coefficient of thermal expansion similar to that of the semiconductor material forming wafer 58. The temperature of space transformer 64 tends to track that of wafer 58 since it is positioned very close to the wafer. When space transformer 64 has the same coefficient of thermal expansion as wafer 58, probes 80 tend to move apart at the same rate as IC pads 54A so that probes 80 remain in contact with IC pads 54A. Since the serpentine flex cable fingers 102 have the flexibility to move in the horizontal plane parallel to the plane of the wafer, and since spring contacts 80B attached to finger 102 above finger tips 54 structurally link fingers 102 to space transformer 64, finger tips 54 also move in a vertical direction perpendicular to the plane of the wafer surface as necessary to remain in contact with pads 54B as pads 54B move apart with increasing wafer temperature.

FIGS. 11 and 12 illustrate another exemplary embodiment of the invention employing an alternative approach for terminating conductors of the flex cables of probe system 100 under space transformer 64. FIG. 11 an upward-directed plan view of the undersides of flex cables 86 having fingers 120 extending under spade transformer 64. FIG. 12 is a partial sectional elevation view of one finger 120 extending between space transformer 64 and an IC 56. Fingers 120 extend over the IC pads 54B that are to be accessed by conductors within fingers 120. Tips 106 on the underside of fingers 120 provide signal paths between I/O pads 54B and the conductors within fingers 120. Probes 80B connected between fingers 120 and pads 81 on the under surface of space transformer 64 do not carry signals, but instead act only as flexible structural members supporting fingers 120 and restricting their range of horizontal motion.

As they extend over pads 54B, fingers 120 may pass over some contacts 54C that are to be accessed via spring contacts 80C attached to and extending downward from pads 81 on the underside of space transformer 64. Lower ends of spring contacts 80C are attached to upper surfaces of vias 122 extending vertically though flex cable fingers 120 to tips 124 mounted on the under surface of flex cable 86 for contacting IC pads 54C. Lower frequency signals may therefore pass between IC pads 54C and pads 81 on the lower surface of space transformer 64 through probes 80C, vias 122 and probe tips 124 while higher frequency signals entering or departing IC pads 54B pass through probe tips 106 and conductors implemented within flex cable fingers 120. Lower frequency signals may also pass between pads 81 and IC pads 54A directly through probes 80A.

FIG. 13 is a sectional elevation view of a probe system 110 in accordance with another exemplary embodiment of the invention that is a variation on probe system 50 of FIG. 5, wherein similar reference characters refer to similar structures. Probe board assembly 110 differs from probe board assembly 50 in that upper ends of conductors within flex cables 86 are terminated on pads 112 formed on the lower surface of interface board 60. Traces and vias (not shown) formed on and within interface board 60 link pads 112 to the pads 85 on the upper surface of the interface board contacted by pogo pins 83.

FIG. 14 is a sectional elevation view of a probe system 120 in accordance with another exemplary embodiment of the invention that is a variation on probe system 100 of FIG. 8, wherein similar reference characters refer to similar structures. FIG. 15 is an expanded sectional elevation view of the portion of the probe system 120 of FIG. 14 residing between space transformer 64 and ICs 56, and FIG. 16 is a plan view looking upward from of wafer 58 toward the under sides of flex cables 86 and space transformer 64.

Probe system 120 of FIG. 14 differs from probe system 100 in that flex cables 86 extend completely under space transformer 64 as best seen in FIGS. 15 and 16. Probe tips 130 mounted on the lower sides of flex cables 86 contact the IC pads 54. Flexible spring contacts 80 attached between pads 81 on the lower surface of space transformer 64 and to pads 132 on the upper surfaces of flex cables 86 above probe tips 130 provide support for cables 86.

Vias 133 through flex cables 86 may link one set of probe tips 130 to the pads 132 above the tips. IC tester 52 is therefore able to communicate with some IC pads 56 by way of paths extending through probe board 60, interposer 62, space transformer 64, spring contacts 80, vias 133 and probe tips 130.

A second set of probe tips 130 formed on the lower surface of flex cables 86 are connected to the signal paths (not shown) provided by flex cable 86 so that IC tester 52 may also communicate with some of IC pads 54 through high frequency signals passing through flex cables 86 and probe tips 130. The spring contacts 80 above the second set of probe tips 130 do not convey signals, but they do provide flexible support for the probe tips.

FIG. 17 is an enlarged plan view of area of flex cable 86 holding one of probe tips 130. Parts of the substrate material of flex cable 86 are removed to create spaces 134 nearly surrounding an island 138 of flex cable substrate holding probe tip 130. Two (or more) small, flexible serpentine bridges 140 of flex cable substrate remain to link each substrate island 138 to the main expanse of flex cable 86. For the set of probe tips 138 that communicate with IC tester 52 through signal paths provided by flex cables 86, those signal paths extend to that set of probe tips 130 through bridges 140.

Bridges 140 and the spring contacts 80 connected to flex cable 86 above islands 138 also hold tips 130 in position above the IC pads 54 (FIG. 13) they contact. As discussed above, IC pads 54 are not perfectly co-planar with one another, and they can move both vertically and horizontally as the ICs under test warm up and expand. Bridges 140 and the spring contact 80 above each probe tip 130 have sufficient flexibility to allow the probe tip 130 to move vertically as necessary to remain in contact an IC pad 54 even though the elevation of the pad may change as the IC wafer begins to warm up.

Although the substrate material of flex cable 86 may not have the same coefficient of thermal expansion as the semiconductor material forming wafer 58 (FIG. 11), the serpentine nature of bridges 140 provides them with sufficient flexibility to allow probe tips 130 to also move horizontally relative to one another and relative to the main body of flex cable 86 as necessary to remain in contact with the IC pads 54 when the pads move horizontally during thermal expansion of the ICs under test.

FIG. 18 is a sectional elevation view of a probe system 150 in accordance with another exemplary embodiment of the invention that is a variation on probe system 110 of FIG. 14, wherein similar reference characters refer to similar structures. FIG. 19 is an expanded sectional elevation view of the portion of the probe system 150 of FIG. 18 residing between space transformer 64 and ICs 56, FIG. 20 is a plan view looking upward from wafer 58 toward the under sides of flex cables 86 and space transformer 64, and FIG. 20 is an enlarged view of a portion of the flex cable 86 of FIG. 20 illustrating a single substrate island 138 linked to flex cable 86 thorough substrate bridges 140.

Probe system 150 provides signal paths between IC tester of FIG. 18 and spring contacts 152 that are attached to the pads 54 of ICs 56. Probe system 150 differs from probe system 110 of FIG. 14 in that in probe system 150 pads 154 on the upper surface of flex cable substrate islands 138 are directly connected by a solder ball array 156 to pads 81 on the lower surface of space transformer 64. Also a pad 158, rather than a probe tip, is formed on the lower surface of each flex cable substrate island 138. Pads 158 are positioned so that they may be contacted by tips of the spring contacts 152 extending upward from the IC pads 54.

Vias 133 extending through some of islands 138 link one set of probe pad 158 to the pads 154 on the upper surface of the islands. IC tester 52 is therefore able to communicate with some IC pads 56 by way of paths extending through probe board 60, interposer 62, space transformer 64, solder balls 156 vias 133, pads 158 and spring contacts 152.

A second set of pads 158 formed on the lower surfaces of substrate islands 138 are connected to the signal paths (not shown) provided by flex cable 86 so that IC tester 52 may also communicate with some of IC pads 54 through high frequency signals passing through flex cables 86, substrate bridges 140, pads 158 and spring contacts 152.

FIG. 22A illustrates another exemplary embodiment of the invention, a multiple-layer probe card assembly 160 for providing signal paths between an integrated circuit tester 162 and pads 163 on surfaces of IC dice 164 on a wafer 166 under test. Probe assembly 160 can also provide remote test equipment (not shown) with signal access to IC pads 163.

Probe card assembly 160 includes a probe board 170 having a set of pads 172 on its upper surface for receiving tips of a set of pogo pin connectors 174 providing signal paths between tester 162 and pads 172. Signal paths extending through one or more flex cables 175 interconnect a set of spring contacts 176 and 178 formed on the upper and lower surfaces of flex cable 175 provide signal paths between a set of pads 180 on the lower surface of probe board 170 and a set of pads 182 on an upper surface of a space transformer board 184. A set of probes 186 provide signal paths between pads 188 on the lower surface of space transformer 184 and IC pads 163. Probe board 170 and space transformer 184 may include single or multiple insulating substrate layers, traces formed on the substrate layers, and vias extending through the substrate layers for conducting signals horizontally and vertically between pads and/or contacts on their upper and lower surfaces.

Some of spring contacts 178 may contact signal paths within flex cables 175 that may extend to probe board 170. Probe board 170 links some of its upper surface contacts 172 to the conductors within the flex cable 175, thereby permitting high frequency or other signals traveling via flex cable 175 to spring contacts 178 and to by-pass transmission line junctions within probe board 170 and between pads 180 and contacts 176. One or more conductors of flex cables 175 may extend to remote equipment (not shown) connected anywhere by any means to a rigid substrate.)

FIG. 22B is a block diagram illustrating an exemplary signal routing scheme within flex cable 175. A flex cable includes a flexible substrate that can be used like a circuit board to hold install small surface mounted devices on a flex cable, including passive devices such as resistors and capacitors and active devices including, for example, integrated circuit switches, multiplexers and the like which can act a signal routing devices. FIG. 22B shows a set of integrated circuit routing switches 191 powered and controlled by signals from one of tester channels for selectively linking the pads 192 on the lower surface of flex cable 175 accessed by spring contacts 178 of FIG. 22A to various other conductors including spring contacts 176 and flex cable conductors leading to tester 162 or to the remote equipment.

The switching arrangement of FIG. 22B is useful, for example, when IC tester 162 and other remote test equipment carry out different types of tests at the IC terminals. For example IC tester 162 may be adapted to carry out logic tests on ICs 164 while the remote equipment may be adapted to carry out parametric tests on the ICs. The remote equipment may also supply the power for the ICs being tested. Some paths to the remote equipment (such as for example those connected to power supplies) may connect directly to spring contacts 178 so that remote equipment and tester 162 can concurrently access various IC pins during a test. To increase the number of ICs that can be concurrently tested, more then one IC tester of the same type can concurrently access the ICs. This is particular feasible in low frequency testing applications where it is not necessary to minimize signal path distances between the test equipment and the ICs being tested. In such case routing switches 191 are not needed since each flex cable conductor and each spring contact 176 accesses a separate spring contact 179. The flex cables 175 can be easily replaced with flex cables have different signal routing arrangements to accommodate changes in routing patterns resulting in changes to the ICs being tested or to accommodate changes in the test equipment.

FIG. 23A is a plan view, of a pair of flex cables 86 passing under a rigid substrate 193 looking upward from a wafer 194 (FIG. 23B) being accessed via a set of probes 195 attached either to space transform 193 or to pads on the surface of wafer 194. Probes 195 pass through a set of windows 196 in flex cables 86. FIG. 23B is a sectional elevation view along cut line B-B of FIG. 23A. FIGS. 23A and 23B illustrate an alternative approach to linking some of probes 156 to conductors 197 in flex cable 86. A set of spring contacts 198 extending between pads on the upper surface of flex cable 86 linked to conductors 197 through vias 199 passing vertically through flex cable 86 and pads 200 on the lower surface of substrate 193. Conductors (not shown) formed within or on the surface of space transformer 193 link pads 200 on the lower surface of substrate 193 contacted by or attached to probes 200. This type of interconnect arrangement can be employed in lieu of or in addition to the interconnect arrangements illustrated in FIGS. 7, 10, 11, 15 and 19.

Figure 24A:
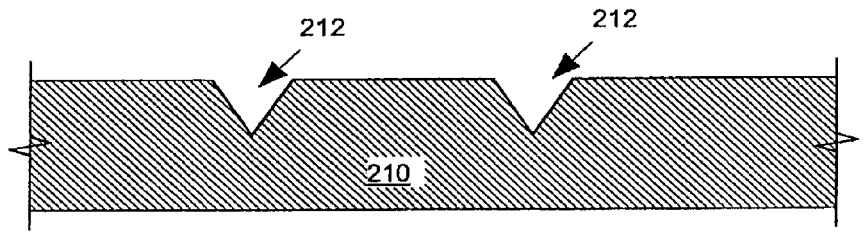
Figure 24B:
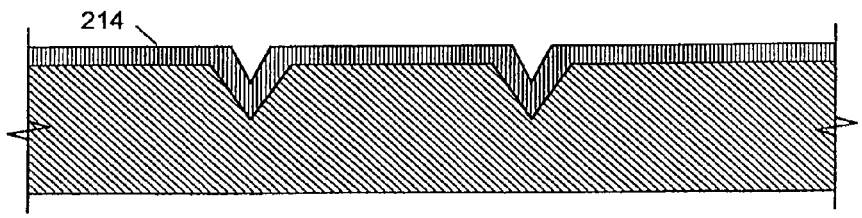
Figure 24C:
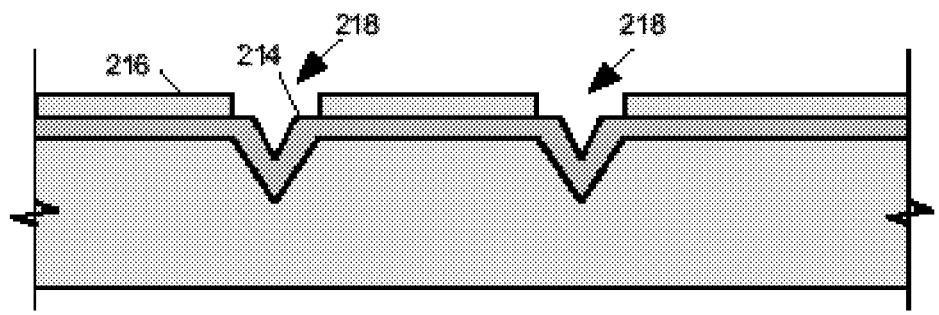
Figure 24D:
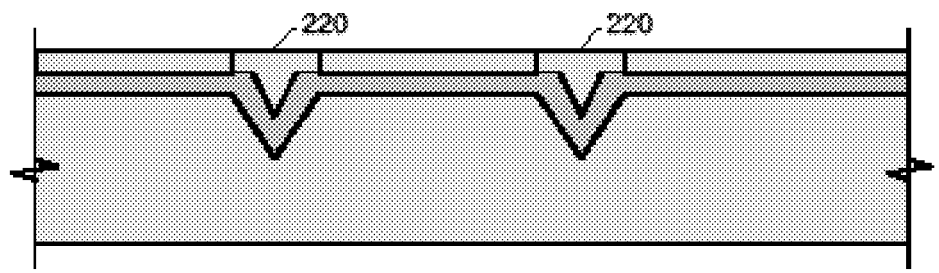
Figure 24E:
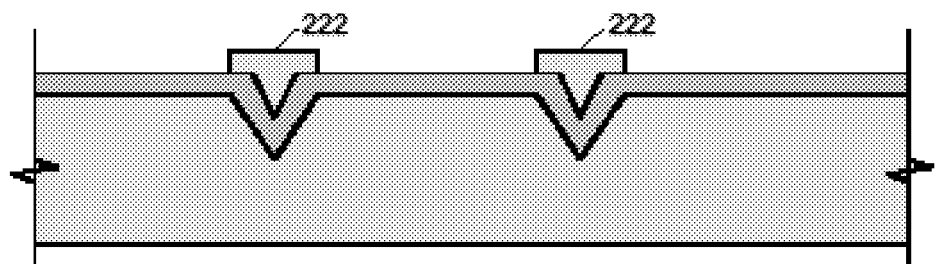
Figure 24F:
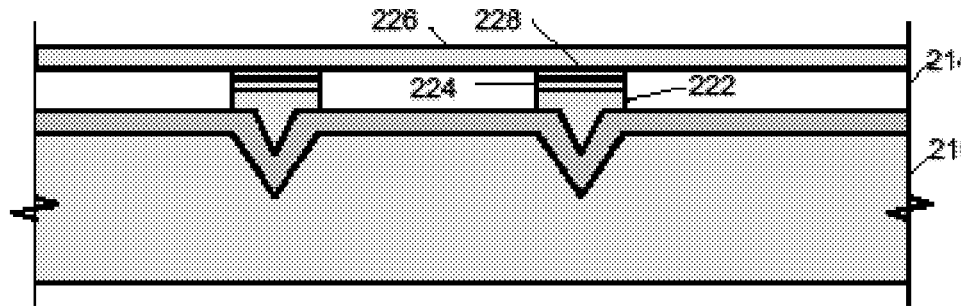

FIGS. 24A-24G illustrate an exemplary process for forming contact tip structures and attaching them to pads of a flex cable so that the cables may be employed in various exemplary embodiments of the invention described herein above. As illustrated in FIG. 24A, a set of pits 210 are suitably formed in a substrate 212 of any suitable material such as, for example, a silicon semiconductor wafer using photolithographic etching or any other suitable technique. A layer 214 of readily etchable releasing/shorting material, such as for example aluminum, is then formed over the upper surface of substrate 210 as illustrated in FIG. 24B. As illustrated in FIG. 24C masking material 216 such as photoresist is then deposited on the releasing/shorting material 214 to form a set of molds 218 defining shapes of the contact tip structures. Referring to FIG. 24D, conductive material 220 that is to form the contact tip structures is then deposited in the molds. The tip structure material 220 may be deposited by electroplating or any other known process of depositing material within a pattern masking material. As illustrated in FIG. 24E, the masking material 216 is then removed to reveal a set of tips 222. As shown in FIG. 24F, the tip structures 222 are then attached to pads 224 on the flex cable 226 using joining material 228 such as, for example, conductive adhesive, solder, brazing material and the like. The release/shorting layer 218 is then removed, for example by etching, to release the tip structures 230 from substrate 210 shown in FIG. 24G.

Releasing/shorting layer 214 thus not only facilitates the formation of tips 222 though electroplating, it also provides a base for tips 222 which can be easily etched to release tips 22 from substrate 210. Releasing/shorting layer 214 may include one or more layers, with a releasing material layer being formed first and a shorting material layer being formed on the releasing material layer.

Figure 24G:
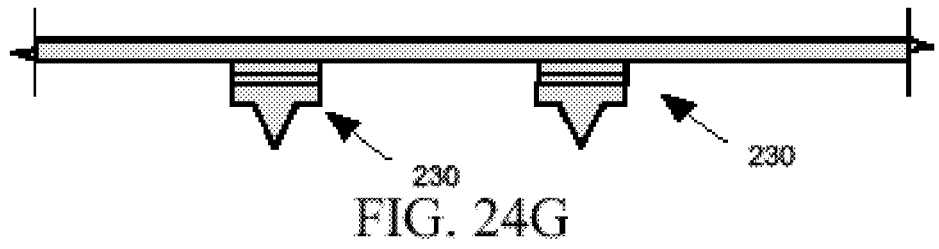

The particular size, shape or contour of tip structure 230 shown in FIG. 24G is not critical to the invention and other suitable tip structures of various sizes and shapes can be formed in a similar manner. Additional exemplary tip structures are disclosed in U.S. patent application Ser. No. 08/819,464, filed Mar. 17, 1997, now abandoned, and U.S. patent application Ser. No. 09/189,761, filed Nov. 10, 1998, both incorporated herein by reference.

The forgoing specification and the drawings depict exemplary embodiments of the best modes of practicing the invention, and elements of the depicted best modes exemplify elements of the invention as recited in the appended claims. It is not intended, however, that the invention be limited to the exemplary embodiments described herein above or to the particular manner in which the embodiments operate. For example, while FIGS. 7, 10, 11 and 15 illustrate exemplary embodiments of the invention employing two or four flex cables 86, it should be understood that the number of flex cables and the number of conductors included in each flex cable can be chosen to suit the requirements of each particular test interconnect application. While pogo pin connectors 66 or 84 (FIG. 4, 5, 13 or 14) may be used to link flex cables 86 or interface board 60 to tester 52, other types of connectors known to those of skill in the art may be employed. The probe board assemblies illustrated in FIGS. 4, 8, 13 and 14 are exemplary and may be implemented using more or fewer interconnected substrate layers. For example, the interposer 62 shown in FIGS. 5, 8, 13, 14 and 18 may be eliminated and the space transfer 64 connected directly to interface board 60. As another example, interposer 62 and space transformer 64 of those figures may be eliminated when probes 80 are formed directly on interface board 60. Also the suggested signal frequency ranges for the various types of signal paths through the probe board assembly and flex cable are exemplary and not intended to be limiting. While the exemplary embodiments of the invention described above are adapted for linking an IC tester to ICs while still in the form of die on a semiconductor wafer, it should be understood that other embodiments of the invention may be used for linking an IC tester to ICs after they have been separated from one another, for example when held in an array on a tray.

The appended claims are therefore intended to apply to any mode of practicing the invention comprising the combination of elements or steps as described in any one of the claims, including elements that are functional equivalents of the example elements of the exemplary embodiments of the invention depicted in the specification and drawings.

What is claimed is:

1. A probe card assembly for providing electrical connection between an integrated circuit tester and a wafer, the probe card assembly comprising:
   an interface board comprising a first rigid substrate and a plurality of first electrical contacts arranged to make electrical connection to the integrated circuit tester when the probe card assembly is coupled to the integrated circuit tester;
   a probe board comprising a second rigid substrate, a plurality of probes disposed on a surface of the second substrate and arranged to make electrical connections to the wafer when the probe card assembly is brought into contact with the wafer, and a plurality of first electrical paths interconnecting first ones of the probes to corresponding ones of the first electrical contacts of the interface board; and
   a flexible cable connected at a first end to the interface board and connected at a second end to the probe board, the flexible cable comprising a plurality of second electrical paths arranged at the first end to make electrical connection to the integrated circuit tester when the probe card assembly is coupled to the integrated circuit tester and electrically connected at the second end to second ones of the probes.

2. The probe card assembly of claim 1, wherein the first end of the flexible cable is disposed in a hole in the interface board.

3. The probe card assembly of claim 2, wherein the first end of the flexible cable comprises a termination block disposed in the hole in the interface board, wherein the termination block holds exposed ends of the second electrical paths in positions corresponding to I/O ports of the integrated circuit tester.

4. The probe card assembly of claim 1, wherein the second electrical paths are attached at the second end of the flexible cable to pads disposed the surface of the second substrate.

5. The probe card assembly of claim 1, further comprising a plurality of flexible cables connected at first ends to the interface board and connected at second ends to the probe board, the flexible cables each comprising a plurality of second electrical paths arranged at the first end to make electrical connection to I/O ports of the integrated circuit tester when the probe card assembly is coupled to the integrated circuit tester and electrically connected at the second ends to second ones of the probes.

6. The probe card assembly of claim 1, further comprising an interposer disposed between the interface board and the probe board, the interposer comprising a plurality of spring contacts disposed within the first electrical paths.

7. A probe card assembly for providing electrical connection between an integrated circuit tester and a wafer, the probe card assembly comprising:

an interface board comprising a first rigid substrate and a plurality of first electrical contacts arranged to make electrical connection to the integrated circuit tester when the probe card assembly is coupled to the integrated circuit tester;

a probe board comprising a second rigid substrate, a plurality of probes disposed on a surface of the second substrate and arranged to make electrical connections to the wafer when the probe card assembly is brought into contact with the wafer, and a plurality of first electrical paths interconnecting first ones of the probes to corresponding ones of the first electrical contacts of the interface board; and a flexible cable connected at a first end to the interface board and connected at a second end to the probe board, the flexible cable comprising a plurality of second electrical paths arranged at the first end to make electrical connection to the integrated circuit tester when the probe card assembly is coupled to the integrated circuit tester and electrically connected at the second end to second ones of the probes, wherein the first end of the flexible cable comprises a termination block disposed in the hole in the interface board, wherein the first end of the flexible cable is disposed in a hole in the interface board and wherein the termination block holds exposed ends of the second electrical paths in positions corresponding to I/O ports of the integrated circuit tester.

* * * * *